United States Patent

[11] 3,629,036

[72] Inventor Calvin Isaacson
Beverley, Mass.

[21] Appl. No. 799,259
[22] Filed Feb. 14, 1969
[45] Patented Dec. 21, 1971
[73] Assignee Shipley Company, Inc.
Newton, Mass.

[54] THE METHOD COATING OF PHOTORESIST ON CIRCUIT BOARDS
12 Claims, 5 Drawing Figs.

[52] U.S. Cl. .......... 156/241, 156/247, 15/249, 96/36.2
[51] Int. Cl. .......... B29c 27/00, B32b 31/12, B32b 31/28
[50] Field of Search .......... 156/247, 248, 249, 241, 155, 182, 305

[56] References Cited

UNITED STATES PATENTS

| | | | |
|---|---|---|---|
| 3,021,250 | 2/1962 | La Voie | 156/247 X |
| 3,256,121 | 6/1966 | Abell | 156/247 X |
| 3,458,376 | 7/1969 | Malik | 156/241 X |
| 3,471,357 | 10/1969 | Bildusas | 156/241 X |
| 3,474,719 | 10/1969 | Levinos | 96/36.3 |
| 3,479,182 | 11/1969 | Chu | 96/33 |

FOREIGN PATENTS

| | | | |
|---|---|---|---|
| 861,283 | 2/1961 | Great Britain | 156/247 |

*Primary Examiner*—Carl D. Quarforth
*Assistant Examiner*—Roger S. Gaither
*Attorney*—Roberts, Cushman & Grover

ABSTRACT: Circuit board base materials, either with or without a layer of copper, have photoresist applied thereto by means which transport said base material past a transfer station. Means in advance of said station apply a liquid solvent for said photoresist to a surface of base material, and means at said transfer station bring into contact with said solvent-coated base surface, a transfer sheet having a layer of photoresist and a backing layer releasably secured thereto whereby said photoresist layer becomes adhered to said surface. Following the transfer station, means are provided for withdrawing said backing layer from said resist layer, which remains secured to the surface of said base.

Inventor
Calvin Isaacson
by Roberts, Cushman & Grover
Atty's

THE METHOD COATING OF PHOTORESIST ON CIRCUIT BOARDS

BACKGROUND OF THE INVENTION

1. Field of the Invention

This invention relates to the application of photosensitive coatings, e.g. photoresists, to substrates such as circuit board base materials used in the production of printed circuit boards, and more particularly, to a new process and apparatus useful therefore.

2. Description of the Prior Art

Photosensitive resists are thin coatings produced from organic solutions which when exposed to light of the proper wavelength are chemically changed in their solubility to certain solvents (developers). Two types are available, negative acting and positive acting. The negative acting resist is initially a mixture which is soluble in its developer but after light exposure becomes polymerized and insoluble to the developer. Exposure is done through a film pattern. The unexposed resist is selectively dissolved, softened, or washed away, leaving the desired resist pattern on the clad laminate. Positive-acting resists work in the opposite fashion, light exposure making the polymer mixture soluble in the developer. The resist image is frequently dyed to make it visible for inspection and retouching. The resist pattern that remains after development (and postbaking in some cases) is insoluble and chemically resistant to the cleaning, plating, and etching solutions used in the production of printed circuit boards. Typical examples of photosensitive materials used for resist formulations include vinyl cinnamate copolymers, benzal acetophones, acetophenone and cinnamate, quaternary salts and azide polymers.

The production of printed circuit boards by a process involving the formation of coatings of photoresists is known. In one process, a metal-clad base sheet is coated with photoresist, for example of the diazo-Novalak resin type, and the photoresist is exposed with the negative of the desired image. The negative areas of the resist are rendered alkali soluble by exposure to light, and they are washed with an alkali to leave the underneath metal layer exposed. An acid, to which the resist is impervious, is used to etch away the exposed metal, and there remains a layer of the metal in the desired image pattern. The remaining resist is in some cases removed and in some retained.

In connection with the process for making printed circuit boards is the provision for and plating of through holes. These holes extend between opposite surfaces of the base sheet, and are used to form an electrical connection therebetween. Typically they are catalyzed and plated with an electroless plating solution.

The surface coating of the photoresist necessary to the above processes has been applied to circuit board base materials in the past by using squeegees, rollers, or wicks or by dipping, to form a layer of liquid resist on the base material, followed by solidification of the resist. A number of drawbacks attend these liquid methods of application:

First, the resist is frequently forced into the through holes, where it (a) may not become sufficiently exposed to become soluble, or (b) may not be dissolved in a reasonable time. In either event, the presence of a residuum or resist in the through holes prevents proper plating.

Second, it is frequently impossible to control the surface of the base material to provide the best surface for coating, because of other requirements that must be met such as receptivity to catalyst, and therefore it is often difficult to get a uniform coating.

Third, in an effort to reduce viscosity to avoid through hole plugging, many known photoresists provide thin coatings which are difficult to uniformly apply to a substrate without defects, and which may provide inadequate electrical or chemical resistance.

An additional technique for applying photoresist has been developed. The photoresist is first coated as a film on a backing sheet, and while still on the backing sheet, the film is adhered by means of heat and pressure to the substrate. The backing sheet is transparent and the film is typically exposed through it. Before developing the photoresist, the backing sheet is removed. Although this technique solves many of the problems heretofore mentioned, such as plugging of the through holes, and provision of a sufficiently thick coating of photoresist, it introduces additional problems and disadvantages of its own.

For example, the range of useful materials is limited because the heat used to apply the photoresist degrades many types of desirable photoresists, and moreover, requires that the backing layer be of a material providing uniform and adequate heat transfer. As a practical matter, bonds are inferior because substrate surfaces are uneven with many minute irregular hills and valleys, and heat bonding of the photoresist film fails to produce enough plasticity to cause the film to do more than bend to the hills and leave voids in the valleys. Such air pockets naturally limit the resolution of images which can be formed with the photoresist, since they permit edge seepage of etchant, and may at times produce an inadequate bond.

An additional problem is that of sensitivity of the process to variation in parameters encountered in expected use. Because the process relies on heat at the photoresist film, it is subject to change whenever different photoresists, substrates, or backing sheets are used because of different heat transfer characteristics thereof. Likewise, changes in ambient temperature effects the process. These changes can be significant because only a limited range of bonding temperatures is suitable. Similarly, the high pressure required for bonding, which is provided by pressure rolls, creates problems in adapting to different substrate thicknesses.

Finally, substrate surface irregularities and inaccurate or biased feed of the photoresist film and substrate often cause lateral forces on the resist and eventual wrinkling of the resist to relieve the forces before or during bonding.

SUMMARY OF THE INVENTION

Objects of the present invention are to provide a system for applying photoresist to a substrate which prevents filling of through holes, which results in a uniform coating, which expands the categories of substrates and resists which can be used together by minimizing the importance of their mutual coating and thermal characteristics, which provides substantially complete bonding, which is easy to control without maintaining a number of critical parameters, and which is simple, reliable, and inexpensive to use.

According to the invention, the photoresist is applied to a surface of the substrate by first applying a liquid adhering agent, preferably a solvent for the resist containing a small amount of dissolved resist, e.g., 0.5 to 5 percent by weight, to the substrate surface, and then bringing the surface into contact with a transfer sheet having a backing or support layer releasably secured to a uniform solidified layer or photoresist, whereby said layer of photoresist becomes surface softened and then adhered to the substrate. Afterwards, the backing layer of the transfer sheet is withdrawn to leave behind a uniform photoresist layer secured to the substrate.

In other aspects, the invention deals with apparatus for applying the photoresist. Other and further novel features and advantages will be apparent from the following description of specific embodiments.

DESCRIPTION OF THE PREFERRED EMBODIMENT

Figure 1:
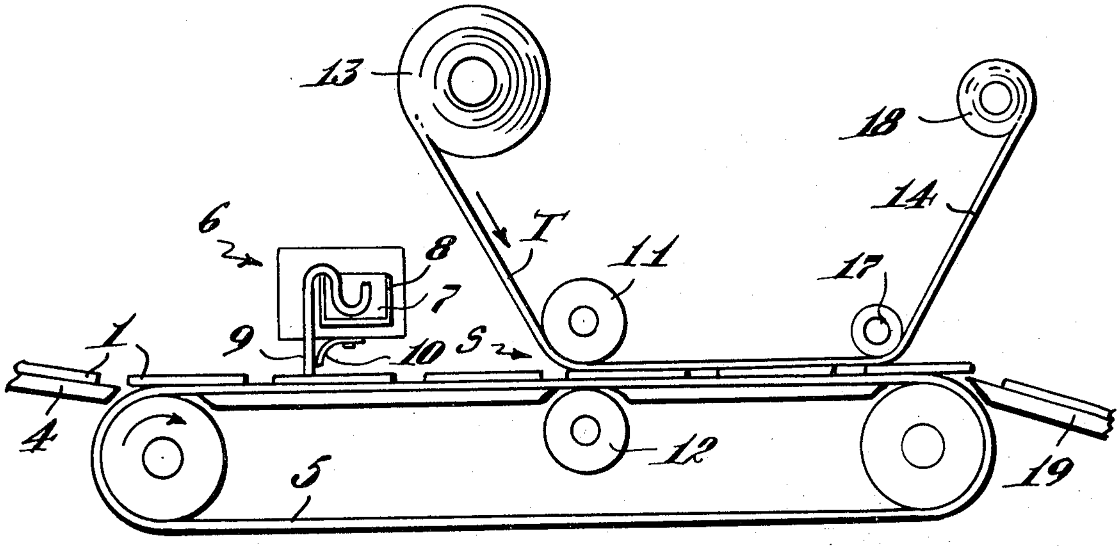
FIG. 1 is a side elevation of the apparatus used to apply photoresist according to the invention.
Figure 2:
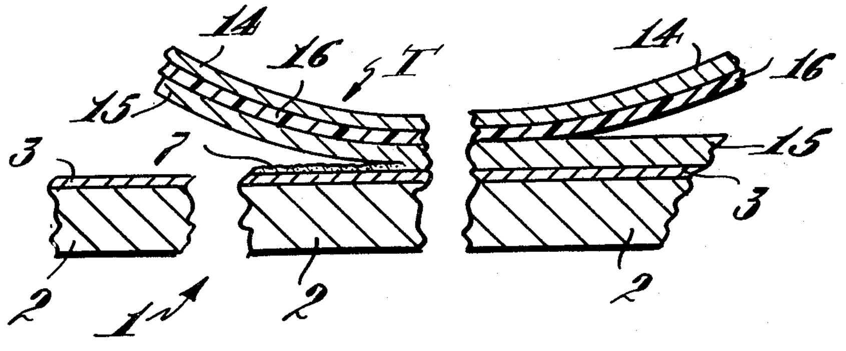
FIG. 2 is an enlarged side sectional view of substrate and transfer sheet, with portions removed and some dimensions exaggerated for clarity, showing different stages of the application of photoresist according to the invention.

FIG. 1 illustrates an example of the invention which may be used to apply photoresist continuously to a succession of precut substrates 1 used as a base material for printed circuit boards. The substrates 1 comprise a layer 2 of plastic, for example phenolic or ABS, and may be unclad, or, as illustrated, clad with a layer of metal 3, for example copper foil (FIG. 2). The present example of printed circuit board making, of course, does not exhaust the possible applications of the invention, which finds use as well in the graphic arts, the making of decals and nameplates, chemical milling, etching, and indeed in any field in which a photoresist is to be put on a substrate made from whatever composition is expedient.

The substrates 1 are fed from a delivery slide 4 to an endless belt 5, which transports them to a transfer station S. In advance of the transfer station S the substrates are carried past a coating apparatus 6 which applies to the upper surfaces of the substrate a uniform layer of liquid adhering agent 7. While the adhering agent may in some cases be a gluelike material, it is necessary that the agent later diffuse away, or, if it remains, be exposed to produce different solubility characteristics and be dissolved and removed by the same materials as are used to dissolve and remove the exposed photoresist. The agent, therefore, desirably exhibits photoresist characteristics itself. Though the adhering agent may be simply a solvent for the photoresist, it preferably comprises a material which is a solvent for the particular photoresist to be applied, and contains a small amount of dissolved photoresist, either the same as or compatible with the photoresist in the film.

The purpose of including dissolved photoresist in the adhering agent is to provide a fill for the minute irregular surface valleys in the substrate, so that the thickness of the adhered film of photoresist will not be appreciably diminished by "-hills" jutting into it. Accordingly, an appropriate amount of dissolved photoresist is approximately equal to the volume of the valleys, such as 0.5 to 5 percent by weight of a solution applied in ten- to twenty-millionths of an inch thickness.

Besides dissolved photoresist, the adhering agent may include small amounts of other additives. One such additive is a material for cleaning the substrate surface to promote a better bond. Where the substrate is copper or another metal foil, the cleaner can be, for example, an organic acid. In many cases this cleaner may be sufficient to prepare the substrate surface so that pretreating steps, necessary with heat bonding, can be omitted. Another such additive is a material for reducing surface energy of the agent 7 to assist it in fully wetting the surface of substrate 1 so that air in surface irregularities will be displaced and no trapped air pockets will be formed. Suitable wetting agents include high molecular weight organic sulfates and sulfonates.

Adhering agent 7 is preferably not too viscous, to air wetting, and is preferably applied in a thin coat to speed bonding, for example, ten- to twenty-millionths of an inch. These factors and their importance will vary, of course, with particular circumstances and particular types of photoresist.

All types of photoresist have a corresponding solvent which can be used in adhering agent 7, and therefore the invention greatly expands the range of usable photoresists beyond the thermoplastics which are alone usable with heat bonding. As indicated above, many suitable formulations and additives for adhering agent 7 are possible. As an example, if light-sensitive diazocompounds are in the photoresist, a suitable solvent is ethylene glycol monomethyl ether with a suitable percent of the photoresist dissolved in it, being about 0.5 to 5 percent by weight.

Coating apparatus 6, as illustrated in FIG. 1, comprises a reservoir 8 containing a supply of the adhering agent 7 fed from means (not shown) maintaining a uniform level therein, and a wick 9 with its upper end immersed in the reservoir and with its lower end held in firm contact with the moving upper surface of a substrate 1 by means of a leaf spring 10. Wick 9 applies to sufficiently uniform coating of agent 7 to the substrate 1 for purposes of the invention, avoids formation of bubbles, does not cause material to cover or remain in through holes, and by filling irregularities in the substrate surface, provides a smooth surface for contacting the photoresist film.

Figure 4:
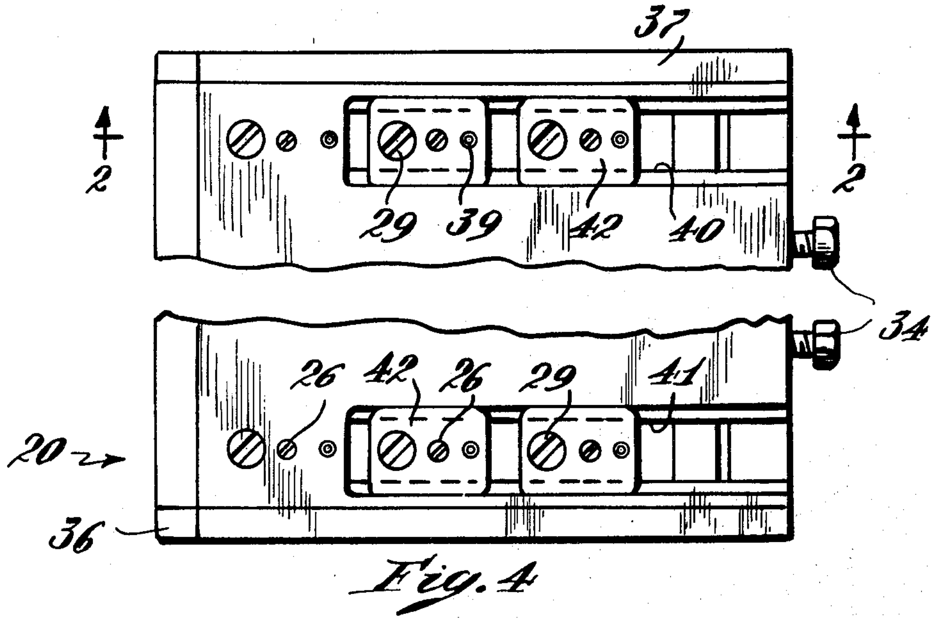
FIG. 4 is a top view of the modified apparatus of FIG. 3.
Figure 3:
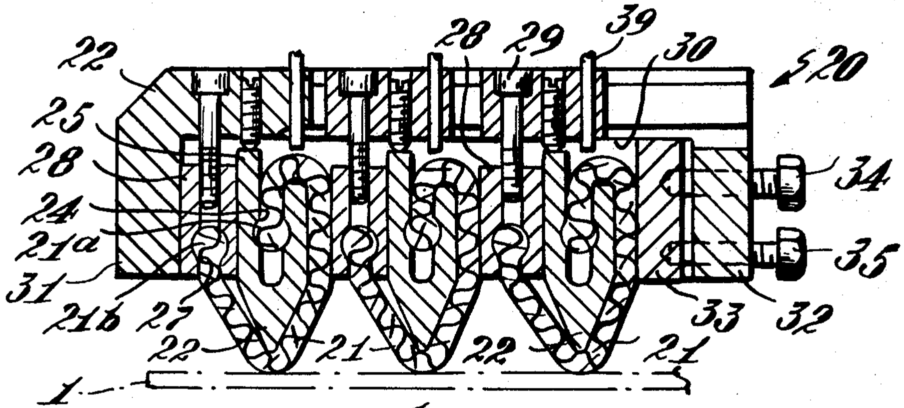
FIG. 3 is a side sectional view of modified applicator apparatus.
Figure 5:
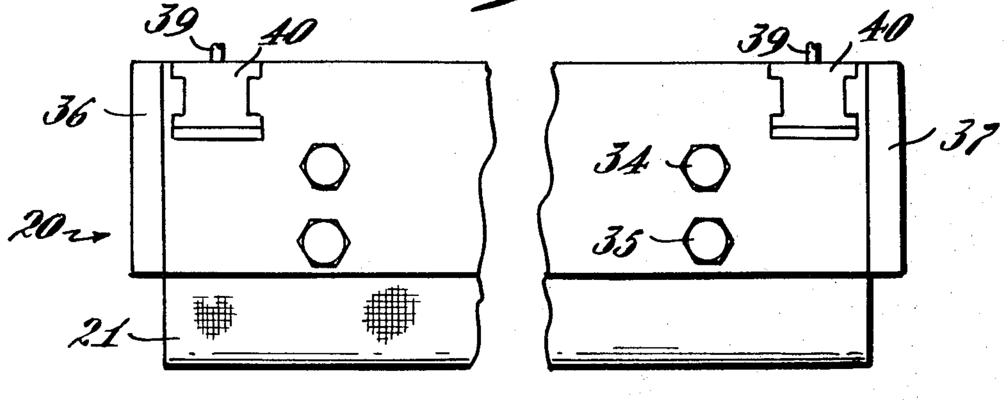
FIG. 5 is an end view of the modified apparatus from the left of FIG. 3.

An improved coating apparatus 20 is illustrated in FIGS. 3 through 5. In this apparatus, means are provided for accurately controlling the capillarity, tension, and position of the applicators which apply adhering agent 7. The apparatus comprises a plurality of wicks 21, here numbering three, mounted within a frame 22. Each wick is formed from a sheet of absorbent material, such as felt, and has enlarged edges 21*a* and 21*b* suitable for gripping. The edges may be provided, for example, by sewing a binding tape in a looped fashion to the edges of the felt and then inserting a rod or dowel of diameter greater than the thickness of the material into the loop. One enlarged end 21*a* of each wick fits within a groove 24 provided in a mounting bar 25. Each mounting bar 25 is substantially U-shaped with one leg of the U shorter than the other. The wicks 21 are trained over the shorter end of the U and around the bottom thereof for contact with the substrates 1. The longer leg of the mounting bar 25 is connected to the frame 22 by means of adjusting screws 26, which permit the mounting bars to be leveled with respect to the surfaces of substrates 1 to insure firm and uniform contact of the wicks 21 therewith. The other enlarged ends 21*b* of the wicks are secured in grooves 27 provided in tension bars 28. The tension bars 28 are free to slide vertically and therefore permit the wicks to be tensioned to control their thickness and therefore to control the pressure of the wicks 21 against the substrates 1. The tension bars 28 are secured to the frame 22 by means of threaded bolts 29 which apply the tension force to the tension bar 28. As shown in FIG. 3, the wicks 21, mounting bars 25 and tension bars 28 lie in stacked relationship within a cavity 30 provided in the frame 22 between frame end pieces 31 and 32. Bearing against the stacked parts is a capillarity adjustment bar 33 which is adapted to squeeze the wicks by means of adjustment screws 34 and 35 in frame end piece 32.

So that the force exerted by capillarity bar 33 will be exerted uniformly on each of the wicks 21, it is necessary that mounting bars 25 and tension bars 28 to be free to slide within the frame 22 which further necessitates that adjustment screws 26 and 29 to free to slide within the frame 22. In the embodiment shown in FIGS. 3 to 5, the sliding relationship is permitted by means of the following construction: Frame 22 is provided with lengthwise grooves 40 and 41 which slidably hold blocks 42 into which are threaded the adjustment screws 26 and 29 for one end of a wick assembly. The blocks 42 have upper and lower flanges to restrict upward and downward movement, but are free to slide lengthwise for adjustment of capillarity. The capillarity adjustment bar 33 as mentioned previously, squeezes wicks 21 and thereby controls the rate of solvent flow through them and hence the rate to the substrate 1. In the applicator apparatus illustrated in FIGS. 3 to 5, solvent is fed to the wicks 21 by means of hoses 39 from a supply of solvent.

The frame 22, as illustrated in FIGS. 4 and 5, comprises not only the end pieces 31 and 32 previously described, but also sidepieces 36 and 37 secured to the main frame portion by means of bolts. The wicks 21, mounting bars 25, tension bars 28, and capillarity adjusting bar 33, are of uniform cross section and extend with their ends adjacent the frame sidepieces 36 and 37. The width of these members will, of course, be selected to suite the range of widths of the substrates to which the adhering agent 7 is to be applied. By making use of applicator apparatus 20 it is possible to get a very uniform, full surface coating on the substrates since the wicks can be adjusted to make full contact with the substrates at an appropriate pressure and with appropriate capillarity to feed a proper amount of agent to them. Naturally, by using a plurality of wicks successively touching the surface of substrates 1, the likelihood that a portion of the substrate surface will be uncoated is diminished.

The apparatus, above described, using wicking means for applying the coating of adhering agent 7 is preferred for reasons stated above. However, other coating means such as roller coating, spraying, dipping or the like, though less preferred, may be substituted without departing from the scope of the invention.

After they have received a coating of adhering agent 7 the substrates 1 are advanced to transfer station S, where upper and lower pressure levels 11 and 12 bring the coated substrate into intimate contact with the transfer sheet T fed from a supply roll 13. Extremely high pressures needed in heat bonding are not necessary here; pressures producing full contact are sufficient. The transfer sheet T, as shown in FIG. 2, comprises a backing or support layer 14 carrying a layer of photoresist 15 releasably secured thereto. Depending on the materials used for backing layer 14 and photoresist 15, it may be advantageous or necessary to provide an interfacial release layer 16 as a surface coating of backing layer 14 to permit the ready release of photoresist 15.

Most available photoresists are suitable for the invention. They need only to be coatable on the backing layer so as to be releasable therefrom after they are secured to the substrate. An example of a suitable photoresist compound is a water-insoluble naphthoquinone-(1,2)-diazide sulfonic acid ester having an —OH group or an esterified —OH group in a neighboring position to a carbonyl group. Included in the photoresist composition may be a resin or a combination of resins, for example, the combination of a Novolak resin with a polyvinyl ether. The photoresist layer is applied to the backing layer 14 by roller coating in 100 to 600 or more microns thickness, with 500 microns or one-half mil preferred.

Suitable examples of suitable photoresist materials are disclosed in U.S. Pat. Nos. 3,046,118; 3,102,809; 3,106,465; 3,130,047; 3,130,048; 3,148,983; 3,061,430; 3,184,310; 3,188,210; 3,201,239; and 3,288,608, all incorporated herein by reference. A preferred composition is disclosed in copending U.S. Pat. application Ser. No. 651,700, filed July 7, 1967, in the name of Carl W. Christensen, the formulation disclosed in example 2 being most preferred.

Suitable materials for the backing layer 14 are determined not by heat transfer characteristics, but the requirements of physical strength and reasonably easy release of photoresist layer 14. Optical transparency or opacity of the backing layer 14 may be desirable as well as explained hereinafter. An example of a backing layer is Transcoat type C, a vinyl-coated release paper manufactured by S. D. Warren Co.

At transfer station S, the transfer sheet T was brought into contact with the previously solvent-coated substrate 1 to secure the layer 15 of photoresist to the substrate. The liquid interface of solvent acts to lubricate the substrate surface to permit the photoresist film if misguided to slide and reduce lateral forces at the film and prevent it from wrinkling. The solvent softens the surface portion of the photoresist layer 15 to effect a bond with the substrate 1, the solvent first causing greater plasticity at the film surface for good microbonding and then diffusing into the photoresist layer to solidify the surface portion thereof in bonded contact against the substrate surface. Using the process of this invention, photoresist film can be applied without the use of heat, which is advantageous not only in preserving the integrity of the photoresist, but also in permitting amplified design of apparatus without heat sources. Limited heating to speed diffusion of the solvent is possible without conflicting seriously with either of these goals. The amount of solvent and dissolved photoresist and additives, the pressure exerted by rolls 11 and 12, the speed of transport through the rolls, and the absence or presence and amount of heat provided by the rolls or elsewhere at transfer station S and all interrelated variables which effect the quality and speed of bonding to some extent and obviously they may need to be correlated with the materials used for substrate and photoresist to obtain the best performance. Some limits or variables are clearly applicable: for example, the pressure exerted by rolls 11 and 12 must not be so great that a bank of softened photoresist builds up at the nip of the rolls to be forced into through holes in the same manner as in roller-coating processes.

The variable that appears to be most important, although not highly critical, is the amount of solvent and dissolved resist which is applied to the substrate, and this is easily controlled through coating apparatus 6 without depending on ambient conditions. The thickness of the solvent coating, moreover, is not as dependent on particular substrates, photoresists, or backing sheets as in heat transferability, and therefore the process disclosed herein is more versatile than heat-bonding processes.

After bonding of substrate and photoresist is effected at transfer station S, the backing layer 14 (with release layer 16 if used) is withdrawn from the photoresist, which remains secured to the substrate 1. In the embodiment illustrated in FIG. 1, this separation is accomplished by feeding the backing layer 14 around a roll 17 up to a takeup reel 18, while the photoresist-coated substrates 1 continue to be carried by endless belt 5 towards an exit slot 19. In some situations, it may be desirable to insert a wedge-shaped bar or the like between the photoresist layer and the backing layer to assist in their separation.

After photoresist layer 15 is bonded to substrate 1 and the backing layer 14 is removed, the photoresist may be exposed to radiation of suitable wavelengths in the proper image pattern as explained previously. Exposure to radiation may also take place before backing layer 14 is removed using a backing layer that is optically transparent, or light-transmitting to the proper degree. A lamp casting light through a mass held against the backing layer may be used to expose the photoresist before the backing layer is removed. In some cases, it may be desirable to print a mask directly on the upper or lower surface of the transparent backing layer to permit dispensing with the mask and to provide finer image resolution by having the operative mask closer to the photoresist to be exposed.

Instead of withdrawing backing layer 14 from the photoresist layer 15 promptly after the latter is secured to the substrate, as illustrated in FIG. 1, it may be desirable to leave a section of the backing layer attached to each substrate to protect the photoresist layer during storage or during an extended delay before imagewide exposure to light is to take place. If the backing layer is optically opaque to exposing radiation, its continued attachment will permit the photoresist-coated substrate to be handled in that radiation without harm. While the opaque backing layer is in place, for example, through holes can be drilled and plated.

It should be understood that the present disclosure is for purposes of illustration and that the invention is broadly inclusive of any and all modifications falling within the terms of the appended claims.

I claim:

1. The method of forming a photoresist-coated board used in the manufacture of circuit boards by applying a layer of photoresist to a substrate comprising:

forming a transfer sheet having a backing layer releasably secured to a layer of light-sensitive photoresist;

applying a uniform coating of liquid adhering agent for said photoresist to a surface of said substrate, said adhering agent wetting said substrate surface containing at least a small amount of dissolved resist and being compatible with eventual exposure and development of said photoresist layer; and contacting a surface of the photoresist layer on the transfer sheet to the liquid adhering coating on the surface of the substrate thereby softening the surface of the photoresist layer that contacts the coating and bonding the photoresist layer to the substrate surface to form said photoresist-coated board, exposing the photoresist layer of the circuit board to a source of activating radiation.

2. The method of claim 1 further comprising separating said backing layer from said photoresist layer after it has been adhered to said substrate and prior to exposure.

3. The method of claim 1 wherein said adhering agent comprises a solvent for said photoresist layer.

4. The method of claim 1 further comprising adding pressure to said transfer sheet while contacting it to said substrate surface.

5. The method of claim 1 wherein said application of adhering agent is carried by wicking said agent to said substrate surface.

6. The method of claim 1 wherein said application of photoresist takes place at a temperature substantially below the temperature at which said photoresist degrades.

7. The method of forming a printed circuit board comprising applying a layer of photoresist to a substrate, said method including the steps of:

forming a transfer sheet having a flexible backing layer releasably secured to a layer of light sensitive photoresist;

applying a uniform coating of a liquid adhering agent for said photoresist to a surface of said substrate, said adhering agent wetting said substrate surface being in part at least a solvent for said photoresist and being compatible with eventual exposure and development of said photoresist layer;

contacting a surface of the photoresist layer on the transfer sheet to the liquid adhering coating on the surface of the substrate thereby softening the contacting surface of said photoresist layer and bonding the photoresist layer to the substrate surface to form a circuit board, exposing said photoresist layer of the circuit board to a source of activating radiation.

8. The method of claim 7 further comprising separating said backing layer from said photoresist layer after it has been adhered to said substrate and prior to exposure.

9. The method of claim 7 further comprising separating said backing layer from said photoresist layer after it has been adhered to said substrate and exposed.

10. The method of claim 7 where said adhering agent further comprises dissolved photoresist material.

11. The method of claim 7 further comprising adding pressure to said transfer sheet while contacting it to said substrate surface.

12. The method of claim 7 wherein said application of photoresist takes place at a temperature substantially below the temperature at which said photoresist degrades.

* * * * *